(12) United States Patent
Tihanyi

(10) Patent No.: US 6,912,153 B2
(45) Date of Patent: Jun. 28, 2005

(54) NON-VOLATILE MEMORY CELL

(75) Inventor: Jenö Tihanyi, Kirchheim (DE)

(73) Assignee: Infineon Technologies AG, Munich (DE)

( * ) Notice: Subject to any disclaimer, the term of this patent is extended or adjusted under 35 U.S.C. 154(b) by 5 days.

(21) Appl. No.: 10/619,125

(22) Filed: Jul. 14, 2003

(65) Prior Publication Data
US 2004/0145938 A1 Jul. 29, 2004

(30) Foreign Application Priority Data
Jul. 12, 2002 (DE) .......................... 102 31 646

(51) Int. Cl.$^7$ .............................................. G11C 11/00
(52) U.S. Cl. ....................... 365/158; 365/175; 365/104
(58) Field of Search ................... 365/158, 175, 365/104, 103, 177, 171, 163, 113, 105, 148, 149, 189.03, 185.11

(56) References Cited

U.S. PATENT DOCUMENTS

| | | | | |
|---|---|---|---|---|
| 5,416,736 A | * | 5/1995 | Kosa et al. ................. | 365/174 |
| 5,714,795 A | | 2/1998 | Ohmi et al. | |
| 5,912,839 A | * | 6/1999 | Ovshinsky et al. ......... | 365/163 |
| 5,933,365 A | * | 8/1999 | Klersy et al. ............... | 365/148 |
| 5,970,336 A | | 10/1999 | Wolstenholme et al. | |
| 6,055,180 A | * | 4/2000 | Gudesen et al. ............ | 365/175 |
| 6,075,720 A | * | 6/2000 | Leung et al. ............... | 365/149 |
| 6,229,733 B1 | | 5/2001 | Male | |
| 6,331,764 B1 | * | 12/2001 | Oglesbee et al. ........... | 320/136 |
| 6,433,567 B1 | * | 8/2002 | Okayasu .................... | 324/760 |
| 2002/0033519 A1 | | 3/2002 | Babcock et al. | |
| 2002/0060338 A1 | | 5/2002 | Zhang | |

FOREIGN PATENT DOCUMENTS

EP   1 063 697 A1   12/2000

OTHER PUBLICATIONS

Geppert, L.: "Reborn Memory May Put Flash in Shade", Spectrum: Virtual War, IEEE, Mar. 2002, pp. 20–21.

* cited by examiner

Primary Examiner—Richard Elms
Assistant Examiner—Dang T Nguyen
(74) Attorney, Agent, or Firm—Laurence A. Greenberg; Werner H. Stemer; Ralph E. Locher

(57) ABSTRACT

A memory cell stores data permanently in a memory material that can assume a first, high-resistance state and a second, low-resistance state, that is in a phase-changeable or ovonic material. A heating device is disposed to heat the memory material at different rates to a programming temperature. The memory material either has a high resistance or a low resistance after cooling, depending on the heating rate. The heating device has a switching device and a heating element in immediate vicinity to the memory material. The switching device has a field-effect transistor and a drain region of the field-effect transistor forms the heating element. Alternatively, the heating element includes a diode or a diode chain.

15 Claims, 4 Drawing Sheets

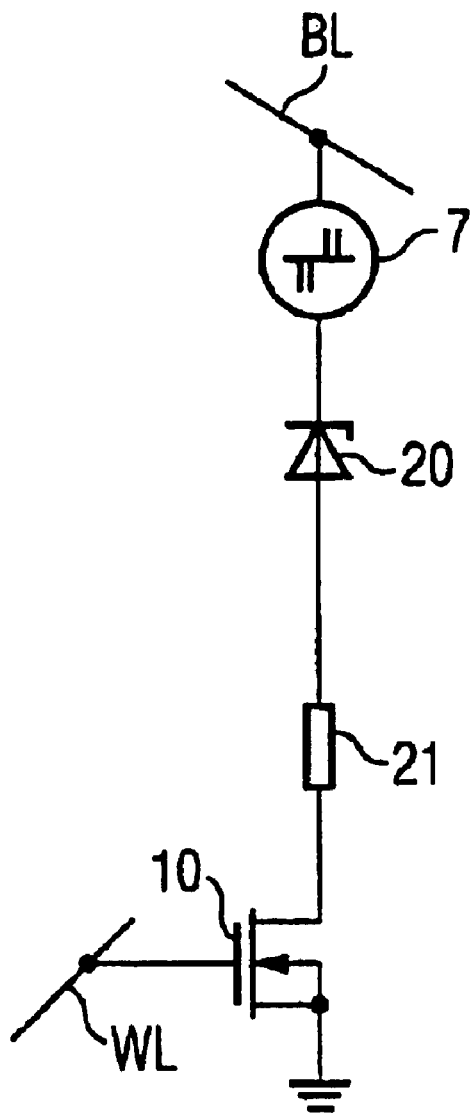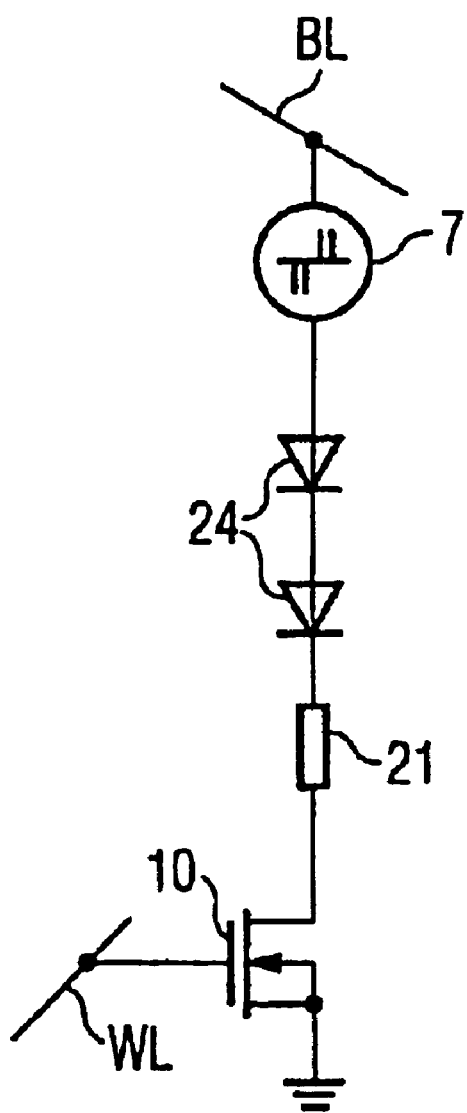

NON-VOLATILE MEMORY CELL

BACKGROUND OF THE INVENTION

Field of the Invention

The invention relates to non-volatile memory cells for the permanent storage of data. The invention relates, in particular, to memory cells in which the storage of data is carried out by an "ovonic" memory material, in particular an ovonic solid-state memory.

The "ovonic" memory material, also referred to a "phase-changeable memory material," can assume a high-resistance state and a low-resistance state. The memory material is usually an alloy which may be present in two phase state forms: in a low-resistance polycrystalline structure and in a high-resistance amorphous structure. In order to bring the memory material into one of the two states, it has to be melted and then cooled again, so that it solidifies in one of the two state forms.

If the memory material is heated rapidly and with a high supply of energy until it melts, the crystal structure of the memory material is destroyed, and it solidifies into the amorphous state on cooling. If the memory material is melted more slowly in a longer heating step with a lower supply of energy, then it assumes a polycrystalline state upon cooling. The memory material has a high resistance in the amorphous state and a lower electrical resistance in the polycrystalline state.

"Reborn Memory May Put Flash in Shade", IEEE spectrum, March 2002, pages 20 to 21, discloses the construction of a memory cell with the aid of such an ovonic memory material. The memory cell shown therein has a heating device with a bipolar transistor and a heating resistor. The heating resistor is provided in direct proximity to the memory material. The memory material and the heating resistor are connected in series with the emitter of the bipolar transistor. Depending on whether reading or writing is to be effected, a specific voltage is present between that terminal of the memory material which is not connected to the heating resistor and the collector of the bipolar transistor. The current through the memory material and the heating resistor can be controlled via the base input of the bipolar transistor.

When the memory cell thus formed is written to, a write voltage, lying above the read-out voltage required for the read-out, is applied as the specific voltage. Through activation of the bipolar transistor with the aid of a control signal applied to the base input, current flows through the memory element, the heating resistor and the bipolar transistor. The current heats the heating resistor and thus the memory material provided in direct proximity to the heating resistor. The heating is controlled by the control signal at the base input and the memory material is heated in this way slowly or rapidly until it melts. After cooling or resolidification, the memory material assumes a high-resistance amorphous or low-resistance polycrystalline state.

Through the activation of the memory cell during read-out with the aid of a control signal supplied via a word line to the base input of the bipolar transistor, a different voltage drop across the entire memory cell can be measured depending on the state of the memory material.

In the case of the integrated construction of such a memory cell, the heating resistor is arranged very near to the bipolar transistor, so that the bipolar transistor is likewise heated to a great extent. Since the melting point of memory materials that are customarily to be used, such as e.g. an alloy comprising germanium, antimony tellurium, is approximately 600° C., it is necessary also to heat the heating resistor up to this temperature range. However, since the functionality of a conventional bipolar transistor is ensured only up to a maximum of 150 to 200° C., overheating of the bipolar transistor and the failure thereof may occur.

SUMMARY OF THE INVENTION

It is accordingly an object of the invention to provide a memory cell configuration which overcomes the above-mentioned disadvantages of the heretofore-known devices and methods of this general type and which provides for a memory cell of the above-mentioned type in which the disadvantage of overheating and destruction of the transistor can be avoided.

With the foregoing and other objects in view there is provided, in accordance with the invention, a memory cell for permanently storing data, comprising:

a memory material capable of assuming a first, high-resistance state and a second, low-resistance state;

a heating device configured to heat the memory material at different heating rates to a programming temperature, the memory material having a relatively high resistance or a relatively low resistance after cooling, depending on the heating rate;

the heating device having a switching device and a heating element in direct proximity with the memory material, and the switching device having a field-effect transistor with a drain region formed as a heating region.

With the above and other objects in view there is also provided, in accordance with the invention, a non-volatile memory cell in which the heating element includes a diode or a diode chain.

A first aspect of the present invention provides a memory cell for the permanent storage of data with an "ovonic" memory material. The memory material can assume a first high-resistance state and a second low-resistance state. A heating device is provided in order to heat the memory material at different rates to a programming temperature, the memory material having high resistance or low resistance after cooling, depending on the heating rate. The heating device has a switching device and a heating element in direct proximity to the memory material. The switching device has a field-effect transistor, a drain region of the field-effect transistor being provided as heating element.

Such a memory cell has the advantage that the heating region is essentially better separated from the active region of the field-effect transistor than in the case of a memory cell according to the prior art. Furthermore, it is not necessary to provide a separate heating element in the form of e.g. a heating resistor, so that the production of such a memory cell can be simplified. Since virtually the entire voltage drop in a field-effect transistor takes place in the drain region, the drain region can simultaneously be used as a heating resistor.

It may furthermore be provided that the drain region comprises a highly doped contact-making region for making contact with the memory material.

It may furthermore be provided that the field-effect transistor is constructed vertically in a substrate and is surrounded by an insulation material having low thermal conductivity. In this way, it is possible to arrange the memory cell according to the invention in integrated form in an array arrangement as well. The insulation material ensures that the heat produced in the drain region of the field-effect transistor is not emitted, or is emitted only to a reduced extent, into the memory material of adjacent cells. Said insulation material may have a silicon compound, in particular silicon dioxide or silicon nitride.

A further aspect of the present invention provides a memory cell for the permanent storage of data with a memory material. A heating device is provided in order to heat the memory material at different rates to a programming temperature, the memory material having high resistance or low resistance after cooling depending on the heating rate. In this case, the heating device has a switching device and a heating element in direct proximity to the memory material. The heating element is designed as a diode or diode chain. In particular, the diode may be designed as a Zener diode operated in the reverse direction.

The Zener diode or the diode chain has the advantage that the heating region is even further away from the active region of the switching device. The Zener diode or the diode chain is chosen such that the largest voltage drop is present across the Zener diode or the diode chain rather than across the switching device, e.g. a transistor, so that the majority of the electrical power in the diode is converted into heat. Consequently, the diode serves as a heating element for the memory material.

Preferably, the diode is formed by a semiconductor material which exhibits functionality at the programming temperature. In particular, the Zener diode may be formed by silicon carbide. A diode made of silicon carbide has the advantage that it is functional even at high temperatures, i.e. at temperatures higher than 600° C. Consequently, the diode can be used as a heating element in a suitable manner since the diode can be dimensioned such that a large part of the voltage is dropped across it, so that the power consumption is greatest across the Zener diode.

It may be provided that the switching device has a field-effect transistor and the diode or the diode chain is formed by a layer sequence on the drain region of the field-effect transistor. The memory cell according to the invention can be produced in a simple manner in this way. Preferably, the drain region of the field-effect transistor and the diode or the diodes are separated by a highly conductive semiconductor layer, in particular a highly doped semiconductor layer, in order to form a thermal resistor between the field-effect transistor and the diode as heating element. In this way, it is possible to prevent the heating element, i.e. the diode, from overheating the active region of the transistor and thus to avoid the destruction or impairment of said transistor.

Other features which are considered as characteristic for the invention are set forth in the appended claims.

Although the invention is illustrated and described herein as embodied in a non-volatile memory cells, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4A is a circuit diagram of a further embodiment of a memory cell according to the invention;

FIG. 4B is a circuit diagram of a further embodiment of a memory cell according to the invention.

DESCRIPTION OF THE PREFERRED EMBODIMENTS

Figure 1A:
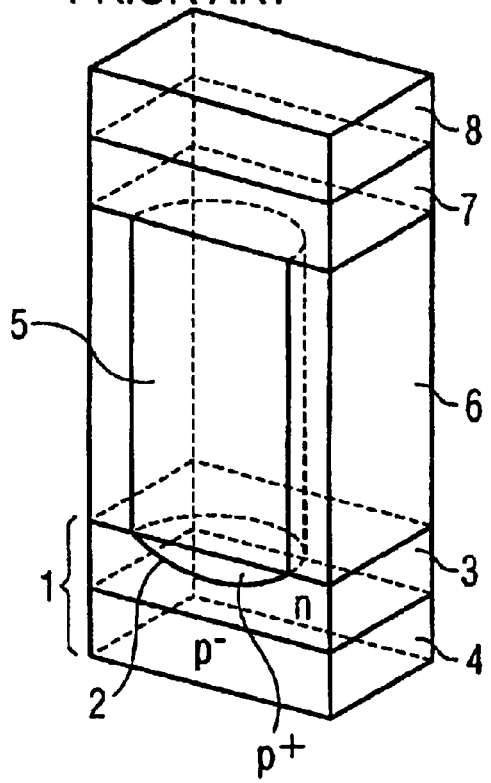
FIG. 1A is a diagrammatic perspective view of the construction of a non-volatile memory cell in accordance with the prior art.

Referring now to the figures of the drawing in detail and first, particularly, to FIG. 1 thereof, there is shown a section of a prior art non-volatile memory cell. The non-volatile memory cell has a selection transistor 1 formed from a emitter region 2, a base region 3, and a collector region 4. A resistance element 5 is connected to the emitter region 2. The element 5 is operated as a heating resistor and it is surrounded by an insulation layer 6. Situated at that end of the resistance element 5 which is remote from the emitter 2 of the bipolar transistor 1 is a layer of an ovonic memory material 7, in which the information is to be stored. A contact-making layer 8 is connected to the memory material 7 in order to make contact with the memory cell.

The "ovonic" memory material 7 is a material from the group of chalcogenides, which are usually formed from alloys. Typical chalcogenides have materials such as, for instance, germanium, antimony, tellurium, sulfur, etc. In particular the ternary alloy germanium-antimony-tellurium represents a suitable material for the construction of this memory cell.

The information is stored in the memory material 7 in that the memory material 7 can be transferred into two different state forms. The memory material 7 can be present in polycrystalline and amorphous form. The memory material 7 essentially has low resistance in its polycrystalline form and essentially has high resistance in the amorphous state. The difference in resistance is so considerable that it can be used for information storage purposes.

The different states of the "ovonic" memory material 7 are achieved by a procedure in which the memory material 7 is momentarily melted and, upon cooling and resolidification, assumes either the polycrystalline or the amorphous form. The fact of whether the polycrystalline or the amorphous form is assumed essentially results from the nature of the heating or melting operation. If the memory material is heated slowly up to the melting point, or to the writing temperature, then the memory material solidifies in an amorphous, i.e. high-resistance, state. By contrast, if the memory material is heated very rapidly to the melting point, then the memory material solidifies in a polycrystalline form and accordingly has a lower resistance than in the amorphous form.

Figure 1B:
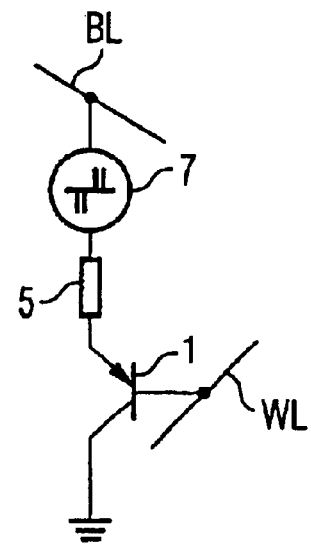
FIG. 1B is a circuit diagram of the memory cell according to the prior art in accordance with FIG. 1A.

FIG. 1B illustrates the circuit diagram of a memory cell constructed in this way. The memory cell is addressed via a word line WL and a bit line BL. The word line WL is connected to the base region of the bipolar transistor 1, a pnp transistor. The collector region 4 of the bipolar transistor 1 is connected to a ground terminal and the emitter region 2 is connected to a first terminal of the heating resistor 5. A second terminal of the heating resistor 5 is connected to a first terminal pad of the memory material 7, so that the heating resistor 5 has a low thermal resistance with respect to the memory material 7. A second terminal pad of the memory material 7 is connected to the bit line BL.

For writing to the memory cell, a write voltage is applied to the bit line. The write voltage is large enough to provide a sufficient power supply for the heating resistor in order to reach the melting point of the memory material 7. Afterward, a control signal is applied to the base region 3 of the bipolar transistor 1 via the word line WL. The control signal determines what information is stored in the memory material 7. The control signal is chosen, for storing a first item of information, such that it brings about a low and relatively lengthy current flow through the memory material and the heating resistor 5. In this case, however, the control signal is chosen such that the current flow is large enough to momentarily bring the memory material to or above its melting point.

In order to store an inverse item of information with respect thereto a control signal is applied to the base input 3 of the bipolar transistor 1 via the word line WL, said control signal effecting a larger current flow through the heating resistor 5 and the memory material 7, so that the memory material 7 is heated more rapidly to the melting point. As a result, the memory material 7 solidifies into an amorphous form upon cooling and thereby acquires high resistance.

The memory cell can then be read by a procedure in which firstly the word line WL is activated and the bipolar transistor 1 is essentially completely turned on. In this way, a current which is dependent on the information stored in the memory material 7 flows via the bit line BL, the memory material 7, the heating resistor 5 and the bipolar transistor 1. Consequently, the read-out of the information can be performed by means of the current flowing via the bit line BL.

Figure 2:
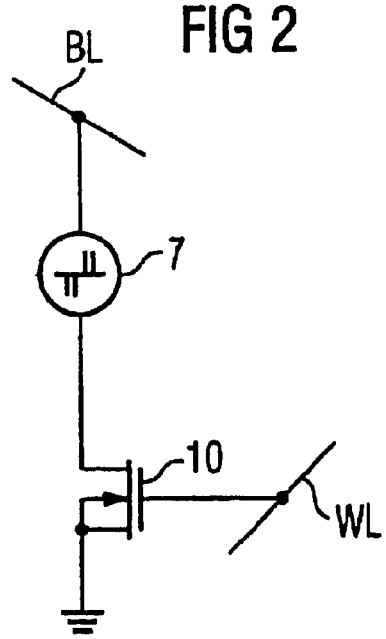
FIG. 2 is a circuit diagram of an embodiment of a memory cell according to the invention.
Figure 3:
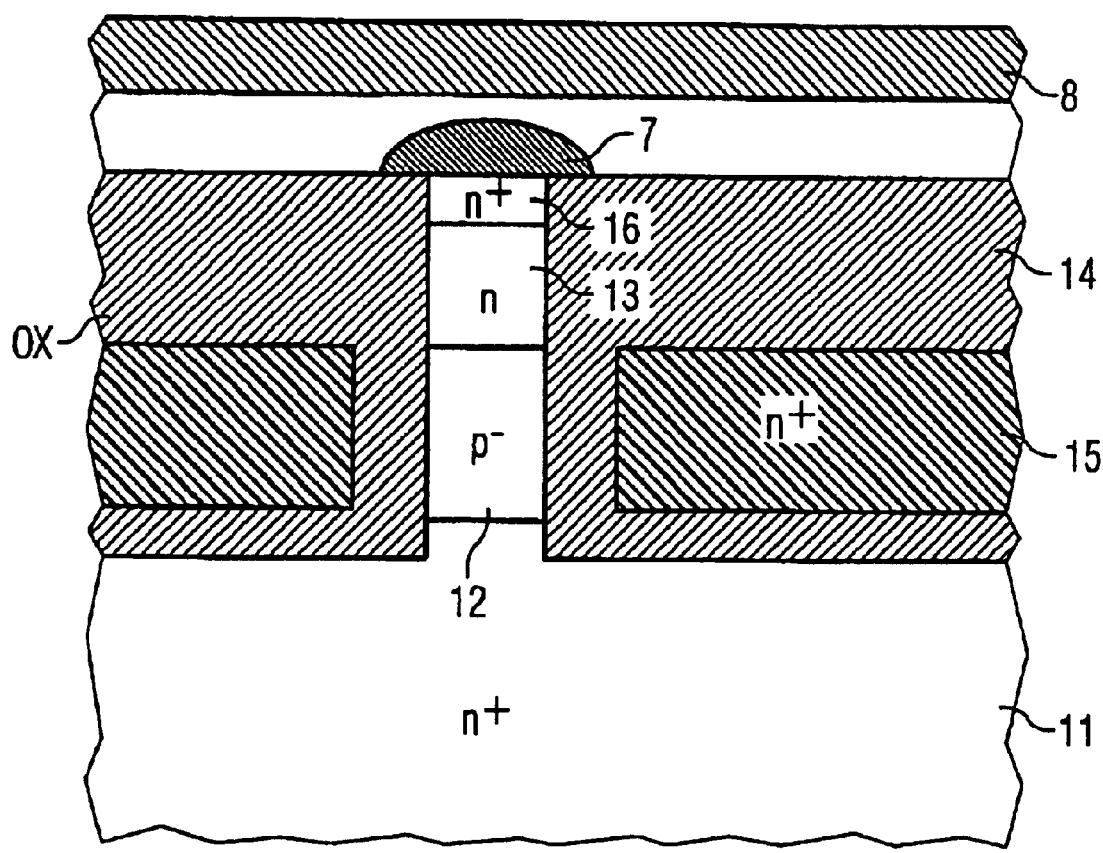
FIG. 3 is a cross section through the construction of the memory cell according to the invention as shown in FIG. 2.

A first embodiment of the invention now provides for the heating resistor 5 to be replaced by an enlarged drain region of a field-effect transistor. The circuit diagram according to FIG. 2 illustrates the circuit of such a memory cell. FIG. 3 shows a cross section through the construction of such a memory cell according to the invention.

The switching transistor is formed by a field-effect transistor 10 comprising silicon. The field-effect transistor is an n-channel transistor and an n-doped source region 11, a p-doped gate layer 12 and an n-doped drain region 13 are formed. The field-effect transistor 10 is constructed vertically in a substrate and is electrically and thermally insulated from its surroundings by an oxide layer 14, preferably a silicon oxide layer. In the oxide layer 14, the gate 15 is arranged in such a way that it can bring about a separation of the charge carriers in the gate region 12. The gate 15 is preferably formed from polysilicon.

Source region 11 and drain region 13 are preferably n-doped, and the gate region 12 is preferably p-doped. The drain region 13 is enlarged relative to conventional field-effect transistors, thus resulting in an LDD field-effect transistor (largely doped drain field-effect transistor). In an LDD field-effect transistor, a large part of the voltage is dropped essentially in the drain region during operation on account of the electrical resistance, so that, in the event of a current flow, the electrical power is converted into heat in the drain region. This heat is used for heating the memory material 7.

Thus, according to the invention, it is no longer necessary to provide a separate heating resistor 5, but instead an enlarged drain region 13 across which a large part of the write voltage is dropped during the process of writing to the memory cell. In order to be able to make better contact between the memory material 7 and the silicon, a highly doped $n^+$-type contact-making layer 16 is provided between the drain region 13 and the memory material 7.

It will be understood that a p-channel field-effect transistor can also be used instead of the n-channel field-effect transistor.

Designs using SiO technology or with semiconductor materials other than silicon also lie within the scope of this invention.

Figure 5:
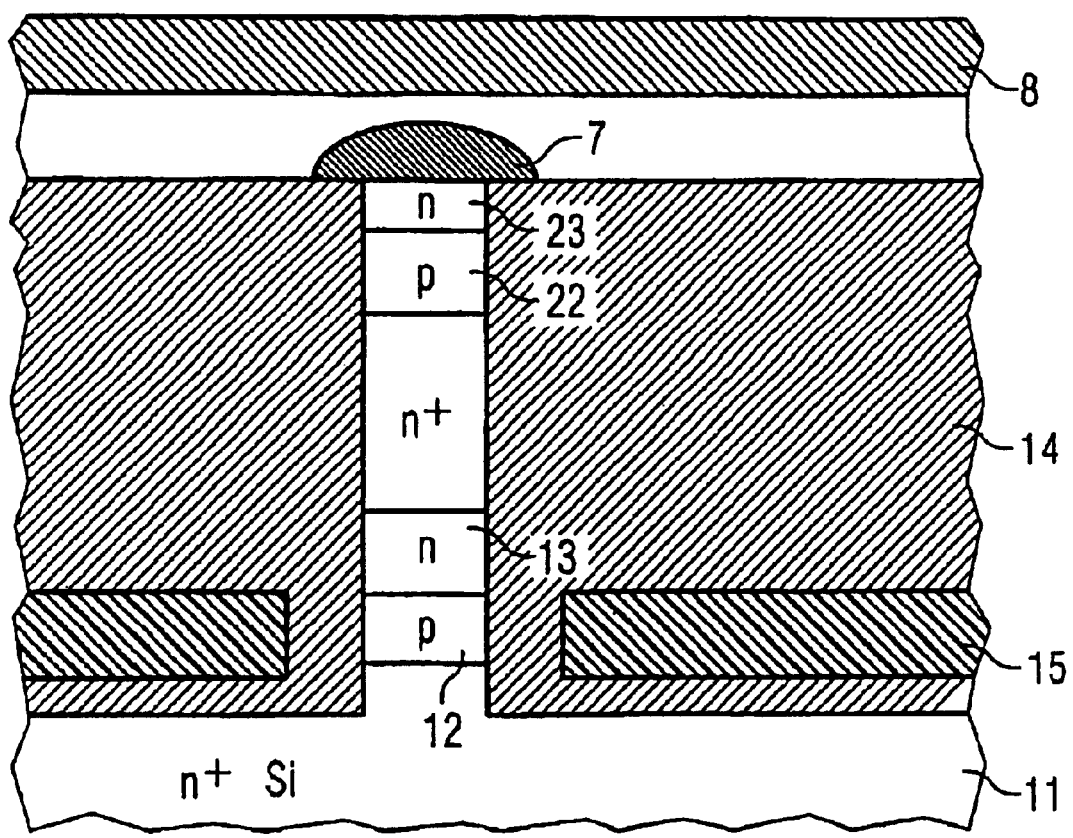
FIG. 5 is a cross section through the further embodiment of the memory cell according to the invention as shown in FIG. 4.

FIGS. 4A and 5 and also FIG. 4B illustrate further embodiments of the present invention. FIG. 4A shows a circuit diagram in which the heating element is designed in the form of a Zener diode 20 which can be operated in the reverse direction. A Zener diode 20 has the effect that it has an essentially current-independent voltage drop across its terminals in reverse-biased operation. In this way, when the field-effect transistor 10 is activated, the large part of the voltage is present across the Zener diode 20.

The Zener diode 20 is arranged in direct proximity to the memory material 7 since the Zener diode 20 takes up virtually the entire power of this current path. As a result, the Zener diode 20 is heated to the greatest extent and can be used for heating up the memory material 7. To ensure that the Zener diode 20 as far as possible does not heat up the field-effect transistor 10 and thus render the latter non-functional, a thermal resistor 21 in the form of a readily conductive, highly doped semiconductor material is provided between the Zener diode 20 and the field-effect transistor 10. The thermal resistor 21 has the task of as far as possible not passing on, or passing on only to a slight extent, the high temperature of the Zener diode 20 to the field-effect transistor 10. Consequently, the thermal resistor 21 should be made of a material which has very good electrical conductivity, in order that it is heated as little as possible on account of the current flow, and have a low thermal resistance. Very highly $n^+$-doped silicon is very highly suitable as thermal resistor.

The Zener diode 20 is preferably produced from a semiconductor material with which the Zener diode 20 remains functional even at very high temperatures. The Zener diode 20 should preferably be able to withstand temperatures at which the memory material 7 can be written to without the Zener diode 20 forfeiting its functionality. Silicon carbide, for example, is conceivable as a suitable material. A Zener diode 20 which has been produced from the material silicon carbide withstands temperatures above 600° C. and is thus able to serve as a heating element for the memory material 7. The Zener diode 20 may equally have materials such as diamond, gallium nitride or semiconductor materials having a large band gap in order still to function as semiconductors at high temperatures of above 400° C. to 600° C.

FIG. 5 illustrates the construction of such a memory cell in cross section. The field-effect transistor 20 is essentially similar to the field-effect transistor in accordance with the embodiment as shown in FIG. 3. A thermal resistor 21 is arranged above the drain region 13 of the field-effect transistor 10. The thermal resistor 21 is formed from a highly doped silicon material, preferably an n-doped silicon material. The size of the region of the thermal resistor 21 is chosen such that this region has a lowest possible electrical resistance in order to keep down the voltage drop in this region and, on the other hand, in order to form a sufficient thermal isolation between the field-effect transistor 10 and the Zener diode 20.

The Zener diode 20 is formed from a p-doped silicon carbide layer 22 and an n-doped silicon carbide layer 23 arranged above the latter. The Zener diode formed by the layers 22, 23 is arranged in direct proximity to the memory material 7.

During operation, i.e. when writing to the memory cell, a large part of the voltage, then, is dropped across the Zener diode 20 and thus heats it. A rapid or slow heating of the memory material 7 can thus be effected, controlled via the gate 15.

FIG. 4B shows a further embodiment of the invention, in which a plurality of conventional diodes 24 are provided as heating element. These diodes 24 are connected in the forward direction and have the voltage drop typical of these diodes, which depends on the semiconductor material, the doping thereof or the band gap thereof. The diodes 24 are connected in series and arranged as compactly as possible in proximity to the memory material 7. The diodes 24 are likewise arranged as pn layers above the thermal resistor region 21 and can be constructed in a similar manner to the Zener diode in FIG. 5.

I claim:

1. A memory cell for permanently storing data, comprising:
    a memory material capable of assuming a first, high-resistance state and a second, low-resistance state;
    a heating device configured to heat said memory material at different heating rates to a programming temperature, said memory material having a relatively high resistance or a relatively low resistance after cooling, depending on the heating rate;
    said heating device having a switching device and a heating element in direct proximity with said memory material, and said switching device having a field-effect transistor with a drain region formed as a heating region.

2. The memory cell according to claim 1, wherein said drain region comprises a highly doped contact-making region for making contact with said memory material.

3. The memory cell according to claim 1, wherein said field-effect transistor is formed vertically in a substrate, and an insulation material having low thermal conductivity surrounds said field effect transistor.

4. The memory cell according to claim 3, wherein said insulation material contains a silicon compound.

5. The method cell according to claim 4, wherein said insulation material is a silicon compound selected from the group consisting of silicon dioxide and silicon nitride.

6. A memory cell for permanently storing data, comprising:
    a memory material capable of assuming a first, high-resistance state and a second, low-resistance state;
    a heating device configured to heat said memory material at different heating rates to a programming temperature, said memory material having a relatively high resistance or a relatively low resistance after cooling, depending on the heating rate;
    said heating device having a switching device and a heating element in direct proximity with said memory material, and said heating element has a diode device.

7. The memory cell according to claim 6, wherein said diode device is a diode or a diode chain.

8. The memory cell according to claim 6, wherein said diode device is formed by a semiconductor material exhibiting functionality at a programming temperature.

9. The memory cell according to claim 6, wherein said switching device is a transistor.

10. The memory cell according to claim 6, wherein said switching device is a field-effect transistor or a bipolar transistor.

11. The memory cell according to claim 6, wherein said switching device has a field-effect transistor and said diode device is formed by a layer sequence on a drain region of said field-effect transistor.

12. The memory cell according to claim 11, which comprises a thermal resistor formed between said layer sequence of said diode device and said drain region of said field-effect transistor.

13. The memory cell according to claim 12, wherein said thermal resistor is a highly conductive semiconductor layer.

14. The memory cell according to claim 6, wherein said thermal resistor is a highly doped semiconductor layer.

15. The memory cell according to claim 6, wherein said diode device comprises one of more Zener diodes.

* * * * *